US011211239B2

(12) United States Patent
Ueda et al.

(10) Patent No.: US 11,211,239 B2
(45) Date of Patent: Dec. 28, 2021

(54) EXTREME ULTRAVIOLET LIGHT GENERATION APPARATUS AND EXTREME ULTRAVIOLET LIGHT GENERATION APPARATUS CONTROLLING METHOD

(71) Applicant: Gigaphoton Inc., Tochigi (JP)

(72) Inventors: Atsushi Ueda, Oyama (JP); Takashi Saito, Oyama (JP)

(73) Assignee: Gigaphoton Inc., Tochigi (JP)

( * ) Notice: Subject to any disclaimer, the term of this patent is extended or adjusted under 35 U.S.C. 154(b) by 69 days.

(21) Appl. No.: 16/786,542

(22) Filed: Feb. 10, 2020

(65) Prior Publication Data
US 2020/0185212 A1 Jun. 11, 2020

Related U.S. Application Data

(63) Continuation of application No. PCT/JP2017/033747, filed on Sep. 19, 2017.

(51) Int. Cl.
H01J 61/28 (2006.01)
H01J 61/02 (2006.01)
H01J 61/12 (2006.01)

(52) U.S. Cl.
CPC ............ H01J 61/28 (2013.01); H01J 61/025 (2013.01); H01J 61/12 (2013.01)

(58) Field of Classification Search
CPC .......... H01J 61/28; H01J 61/025; H01J 61/12; G03F 7/70916; G03F 7/70033; H05G 2/005
See application file for complete search history.

(56) References Cited

U.S. PATENT DOCUMENTS

2007/0228298 A1 10/2007 Komori et al.
2008/0011967 A1 1/2008 Van Herpen et al.
(Continued)

FOREIGN PATENT DOCUMENTS

JP 2007-273239 A 10/2007
JP 2009-253032 A 10/2009
(Continued)

OTHER PUBLICATIONS

International Search Report issued in PCT/JP2017/033747; dated Nov. 14, 2017.
(Continued)

Primary Examiner — Donald L Raleigh
(74) Attorney, Agent, or Firm — Studebaker & Brackett PC

(57) ABSTRACT

An EUV light generation apparatus includes: a chamber; an EUV light condensing mirror positioned inside the chamber and having a reflective surface that determines a first focal point and a second focal point, the reflective surface and the second focal point being positioned on respective sides of a first surface; at least one magnet configured to generate a magnetic field at and around the first focal point; a first gas supply unit configured to supply first gas to the reflective surface in the chamber and opened near an outer peripheral part of the reflective surface; a second gas supply unit configured to supply second gas into the chamber and opened at a position between the first surface and the second focal point; and a discharge device configured to discharge gas inside the chamber and opened at a position between the first focal point and the at least one magnet.

15 Claims, 14 Drawing Sheets

(56) References Cited

U.S. PATENT DOCUMENTS

| | | | |
|---|---|---|---|
| 2009/0057567 A1 | 3/2009 | Bykanov et al. | |
| 2009/0250641 A1 | 10/2009 | Moriya et al. | |
| 2011/0226745 A1 | 9/2011 | Nagai et al. | |
| 2012/0223257 A1* | 9/2012 | Nagai | B23K 26/36 250/504 R |

FOREIGN PATENT DOCUMENTS

| | | | |
|---|---|---|---|
| JP | 2009-544148 A | 12/2009 | |
| JP | 2012-169580 A | 9/2012 | |
| WO | 2017/084872 A1 | 5/2017 | |
| WO | WO-2018211569 A1 * | 11/2018 | G03F 7/70916 |

OTHER PUBLICATIONS

International Preliminary Report on Patentability and Written Opinion issued in PCT/JP2017/033747; dated Mar. 24, 2020.

\* cited by examiner

EXTREME ULTRAVIOLET LIGHT GENERATION APPARATUS AND EXTREME ULTRAVIOLET LIGHT GENERATION APPARATUS CONTROLLING METHOD

CROSS-REFERENCE TO RELATED APPLICATIONS

The present application is a continuation application of International Application No. PCT/JP2017/033747 filed on Sep. 19, 2017, the entire contents of which are hereby incorporated by reference.

BACKGROUND

1. Technical Field

The present disclosure relates to an extreme ultraviolet light generation apparatus and an extreme ultraviolet light generation apparatus controlling method.

2. Related Art

Recently, miniaturization of a transfer pattern in optical lithography of a semiconductor process has been rapidly proceeding along with miniaturization of the semiconductor process. Minute fabrication at 70 nm to 45 nm and further minute fabrication at 32 nm or smaller will be requested in the next generation technology. To meet the request for minute fabrication at 32 nm or smaller, for example, it is desired to develop an exposure apparatus including an extreme ultraviolet light generation apparatus configured to generate extreme ultraviolet (EUV) light at a wavelength of 13 nm approximately in combination with reduced projection reflective optics.

Proposed EUV light generation apparatuses include three kinds of apparatuses of a laser produced plasma (LPP) apparatus that uses plasma generated by irradiating a target material with a pulse laser beam, a discharge produced plasma (DPP) apparatus that uses plasma generated by electrical discharge, and a synchrotron radiation (SR) apparatus that uses synchrotron radiation.

LIST OF DOCUMENTS

Patent Documents

Patent Document 1: US Published Patent Application No. 2009/0057567
Patent Document 2: International Patent Publication No. 2017/084872

SUMMARY

An extreme ultraviolet light generation apparatus according to an aspect of the present disclosure includes: a chamber; an EUV light condensing mirror positioned inside the chamber and having a reflective surface that determines a first focal point and a second focal point, the reflective surface and the second focal point being positioned on respective sides of a first surface that is orthogonal to a first straight line passing through the first and second focal points and passes through the first focal point; at least one magnet configured to generate a magnetic field at and around the first focal point; a first gas supply unit configured to supply first gas into the chamber and opened near an outer peripheral part of the reflective surface to cause the first gas to flow to the reflective surface; a second gas supply unit configured to supply second gas into the chamber and opened at a position between the first surface and the second focal point; and a discharge device configured to discharge gas inside the chamber and opened at a position between the first focal point and the at least one magnet.

An extreme ultraviolet light generation apparatus controlling method according to an aspect of the present disclosure is a method of controlling an extreme ultraviolet light generation apparatus including: a chamber; and an EUV light condensing mirror positioned inside the chamber and having a reflective surface that determines a first focal point and a second focal point, the reflective surface and the second focal point being positioned on respective sides of a first surface that is orthogonal to a first straight line passing through the first and second focal points and passes through the first focal point, the method including: generating a magnetic field at and around the first focal point; supplying first gas into the chamber from near an outer peripheral part of the reflective surface to the reflective surface; supplying second gas into the chamber from a position between the first surface and the second focal point; and discharging gas inside the chamber from a position through which the magnetic field passes.

BRIEF DESCRIPTION OF THE DRAWINGS

Embodiments of the present disclosure will be described below as examples with reference to the accompanying drawings.

DESCRIPTION OF EMBODIMENTS

<Contents>
1. Overall description of extreme ultraviolet light generation system
    1.1 Configuration
    1.2 Operation
2. EUV light generation apparatus according to comparative example
    2.1 Chamber
    2.2 EUV light condensing mirror
    2.3 Magnet
    2.4 Discharge device
    2.5 First gas supply unit
    2.6 Obscuration region
    2.7 Flow of first gas
    2.8 Problem
3. EUV light generation apparatus including second gas supply unit
    3.1 Configuration
    3.2 Operation and effect
4. Variations of second gas supply unit
    4.1 First modification
    4.2 Second modification
    4.3 Third modification
    4.4 Fourth modification
    4.5 Fifth modification
    4.6 Sixth modification
    4.7 Seventh modification
    4.8 Eighth modification
5. Others Embodiments of the present disclosure will be described below in detail with reference to the accompanying drawings. The embodiments described below are examples of the present disclosure, and do not limit the contents of the present disclosure. Not all configurations and operations described in each embodiment are necessarily essential as configurations and operations of the present disclosure. Components identical to each other are denoted by an identical reference sign, and duplicate description thereof will be omitted.

Figure 1:
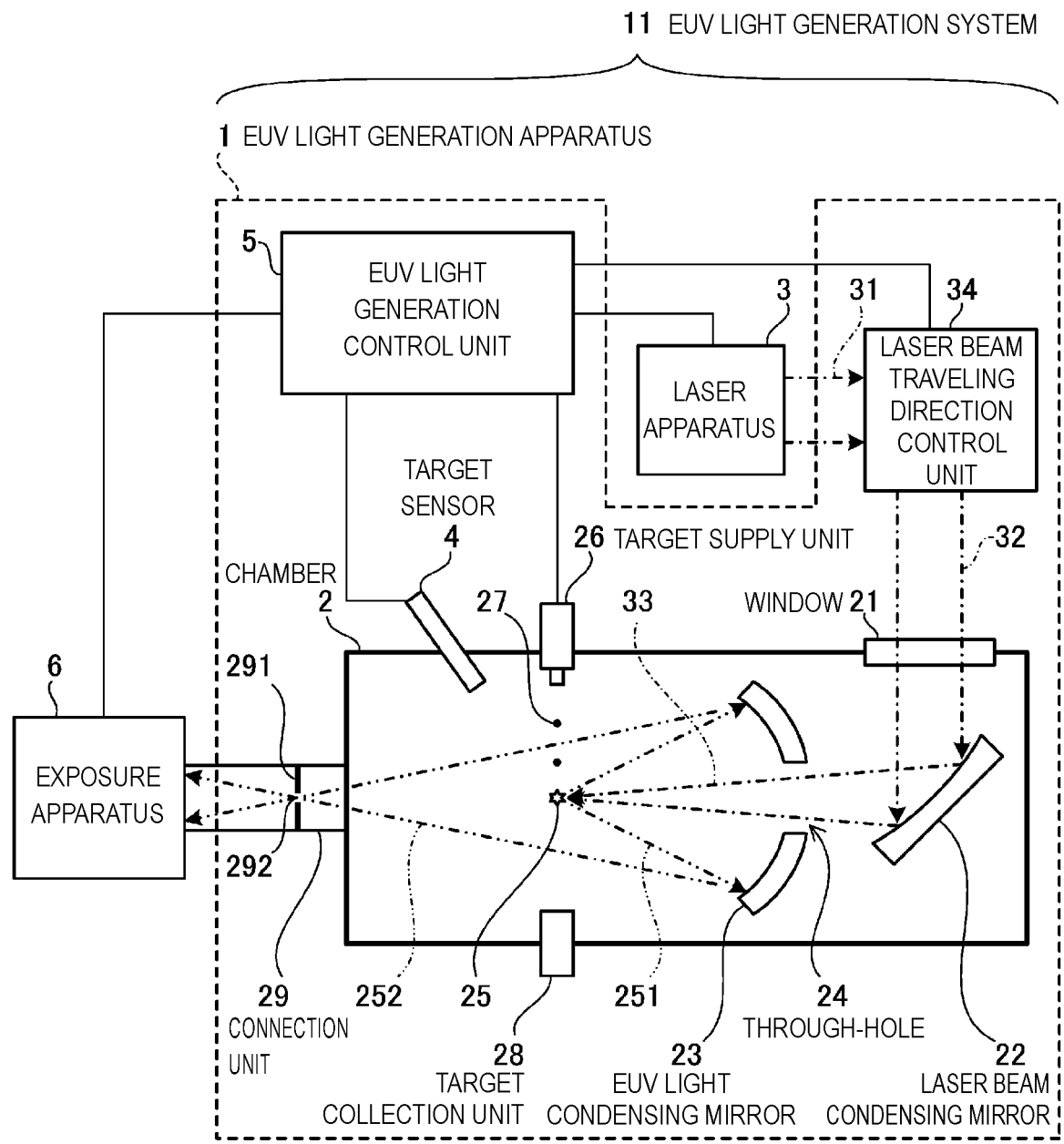
FIG. 1 schematically illustrates the configuration of an exemplary LPP EUV light generation system.

1. OVERALL DESCRIPTION OF EXTREME ULTRAVIOLET LIGHT GENERATION SYSTEM 1.1 Configuration FIG. 1 schematically illustrates the configuration of an exemplary LPP EUV light generation system. This EUV light generation apparatus 1 is used together with at least one laser apparatus 3. In the present application, a system including the EUV light generation apparatus 1 and the laser apparatus 3 is referred to as an EUV light generation system 11. As illustrated in FIG. 1 and described below in detail, the EUV light generation apparatus 1 includes a chamber 2 and a target supply unit 26. The chamber 2 is configured to be sealable. The target supply unit 26 is attached to, for example, penetrate through a wall of the chamber 2. The material of a target substance output from the target supply unit 26 includes tin. The material of the target substance may include any combination of tin and terbium, gadolinium, lithium, or xenon.

The wall of the chamber 2 is provided with at least one through-hole. The through-hole is provided with a window 21. A pulse laser beam 32 emitted from the laser apparatus 3 transmits through the window 21. An EUV light condensing mirror 23 having, for example, a spheroidal reflective surface is disposed inside the chamber 2. The EUV light condensing mirror 23 has first and second focal points. For example, a multi-layer reflective film obtained by alternately stacking molybdenum and silicon is formed on the surface of the EUV light condensing mirror 23. The EUV light condensing mirror 23 is disposed so that, for example, the first focal point is positioned in a plasma generation region 25 and the second focal point is positioned at an intermediate focal point (IF) 292. A through-hole 24 is provided at a central part of the EUV light condensing mirror 23. A pulse laser beam 33 passes through the through-hole 24.

The EUV light generation apparatus 1 includes, for example, an EUV light generation control unit 5 and a target sensor 4. The target sensor 4 has an imaging function and is configured to detect the existence, locus, position, speed, and the like of a target 27.

In addition, the EUV light generation apparatus 1 includes a connection unit 29 that provides communication between the inside of the chamber 2 and the inside of an exposure apparatus 6. A wall 291 through which an aperture is formed is provided inside the connection unit 29. The wall 291 is disposed so that the aperture is positioned at the second focal point position of the EUV light condensing mirror 23.

In addition, the EUV light generation apparatus 1 includes, for example, a laser beam traveling direction control unit 34, a laser beam condensing mirror 22, and a target collection unit 28 for collecting the target 27. The laser beam traveling direction control unit 34 includes an optical element for defining the traveling direction of a laser beam and an actuator for adjusting the position, posture, and the like of the optical element.

1.2 Operation

As illustrated in FIG. 1, a pulse laser beam 31 emitted from the laser apparatus 3 passes through the laser beam traveling direction control unit 34 and is incident in the chamber 2 through the window 21 as the pulse laser beam 32. The pulse laser beam 32 travels along at least one laser beam path in the chamber 2 and is reflected by the laser beam condensing mirror 22 and incident on at least one target 27 as the pulse laser beam 33.

The target supply unit 26 outputs the target 27 toward the plasma generation region 25 inside the chamber 2. The target 27 is irradiated with at least one pulse included in the pulse laser beam 33. Plasma is generated when the target 27 is irradiated with the pulse laser beam, and radiates radiation light 251. The EUV light condensing mirror 23 reflects EUV light included in the radiation light 251 at a reflectance higher than that for light in any other wavelength band. Reflected light 252 including the EUV light reflected by the EUV light condensing mirror 23 is focused at the intermediate focal point 292 and emitted to the exposure apparatus 6. One target 27 may be irradiated with a plurality of pulses included in the pulse laser beam 33.

The EUV light generation control unit 5 collectively controls the entire EUV light generation system 11. The EUV light generation control unit 5 processes, for example, image data of the target 27 captured by the target sensor 4. In addition, the EUV light generation control unit 5 controls, for example, the output timing of the target 27 and the output direction of the target 27. In addition, the EUV light generation control unit 5 controls, for example, the oscillation timing of the laser apparatus 3, the traveling direction of the pulse laser beam 32, and the focusing position of the pulse laser beam 33. These various kinds of control are merely exemplary, and may include other control as necessary.

2. EUV LIGHT GENERATION APPARATUS ACCORDING TO COMPARATIVE EXAMPLE

Figure 2A:
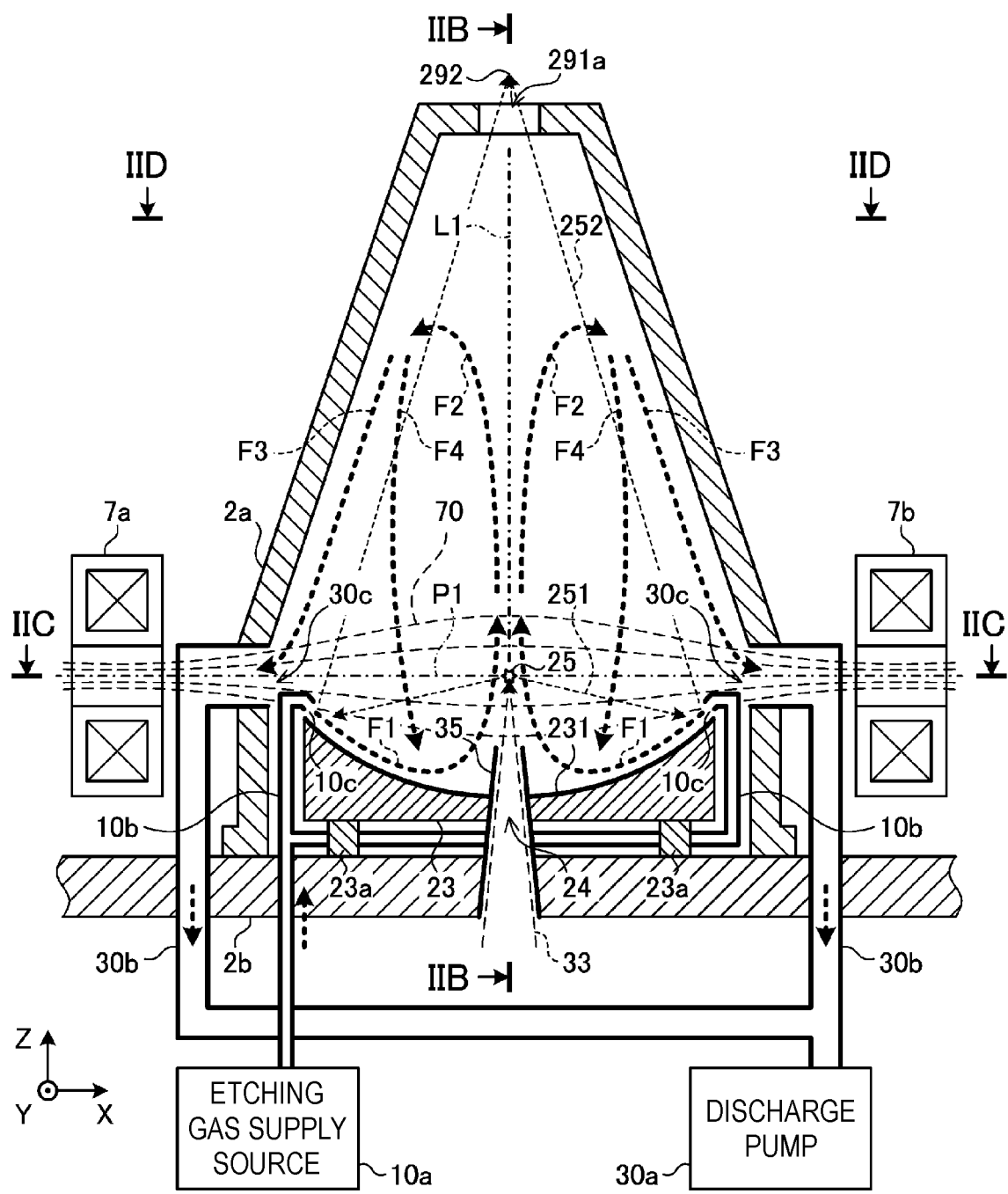
FIG. 2A schematically illustrates the configuration of an EUV light generation apparatus according to a comparative example.
Figure 2B:
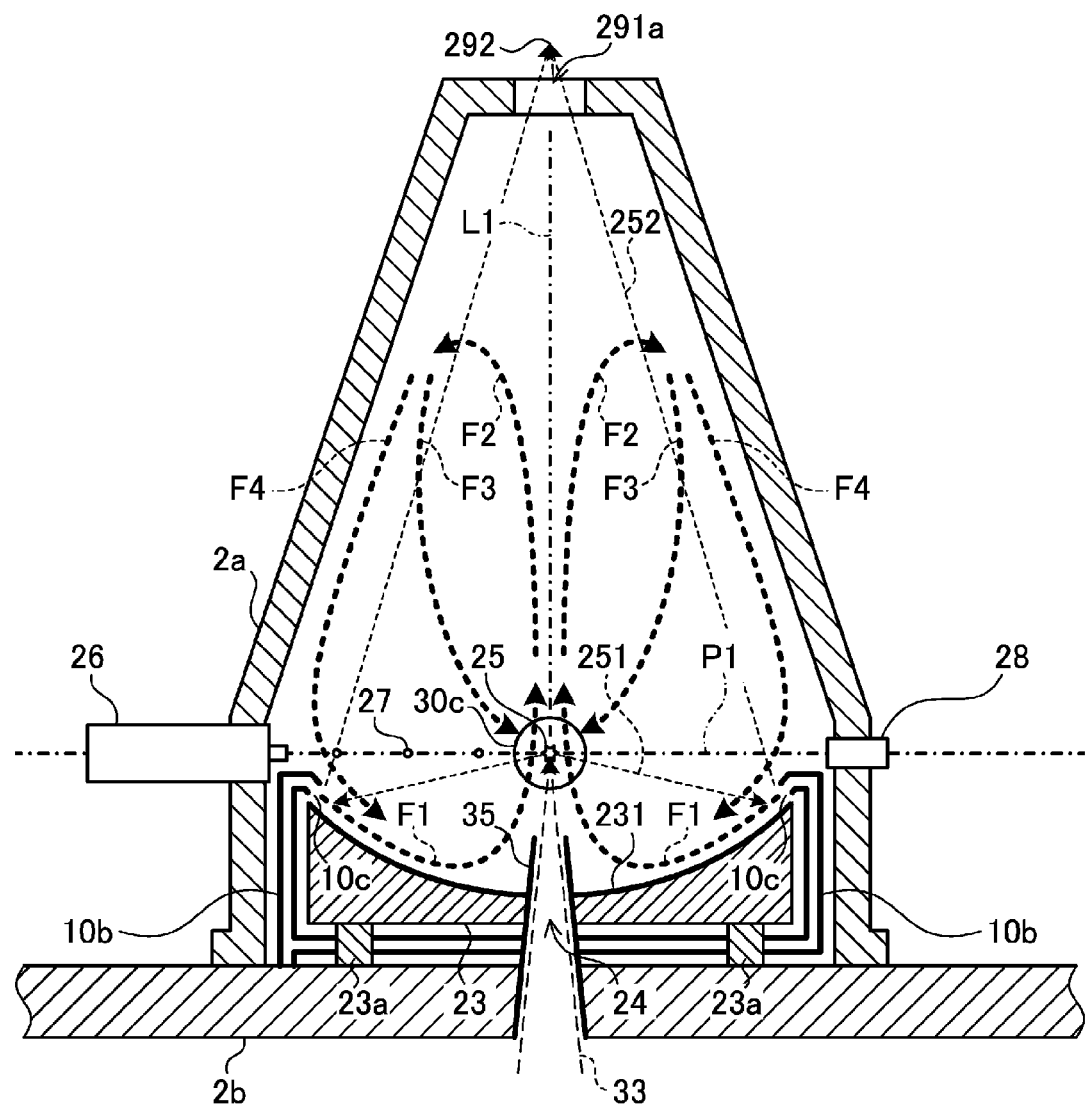
FIG. 2B is a cross-sectional view taken along line IIB-IIB in FIG. 2A.
Figure 2C:
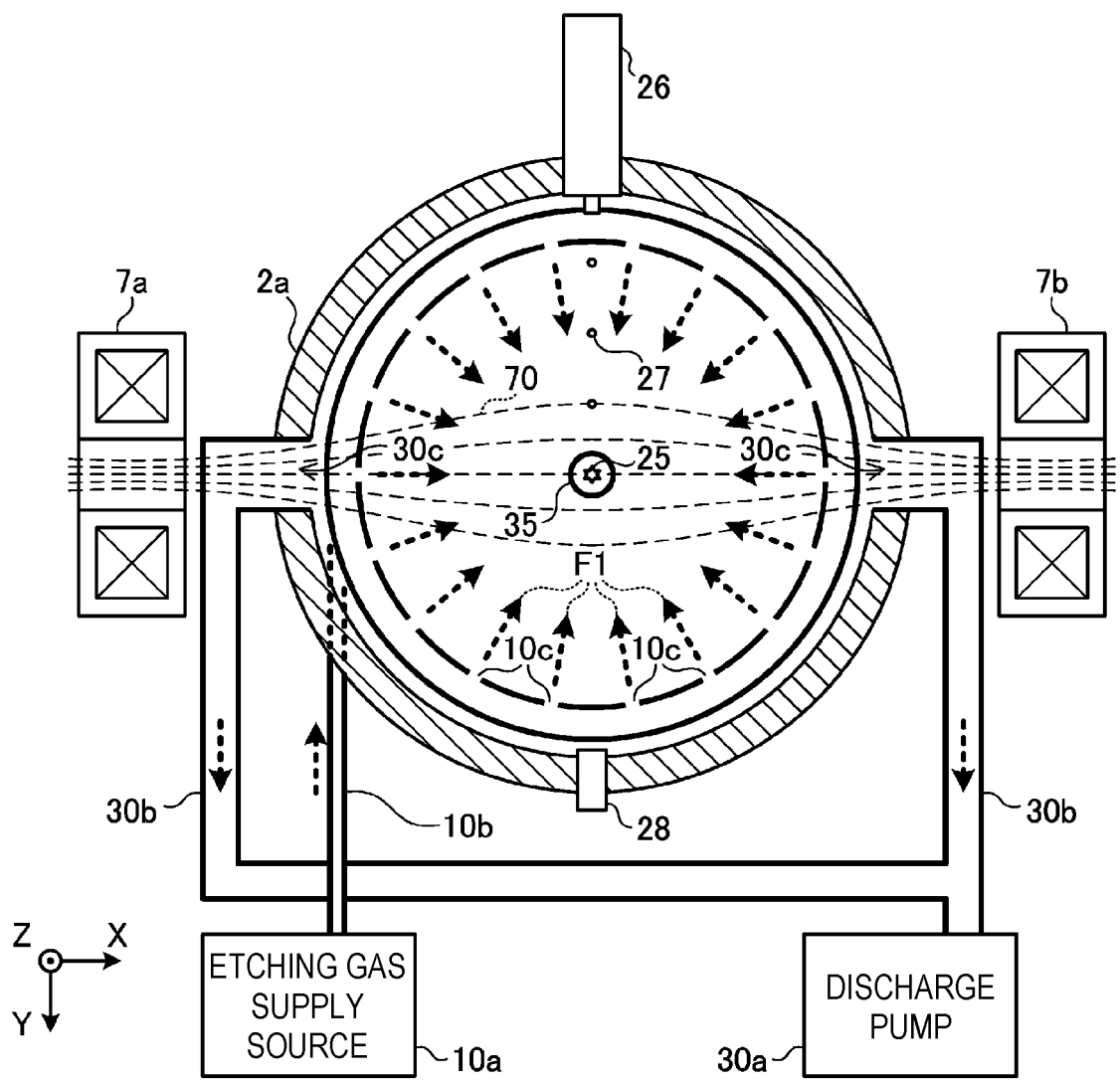
FIG. 2C is a cross-sectional view taken along line IIC-IIC in FIG. 2A.
Figure 2D:
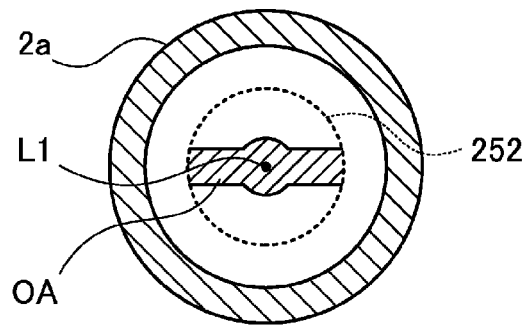
FIG. 2D is a cross-sectional view taken along line IID-IID in FIG. 2A.

FIG. 2A schematically illustrates the configuration of the EUV light generation apparatus according to a comparative example. FIG. 2B is a cross-sectional view taken along line IIB-IIB in FIG. 2A. FIG. 2C is a cross-sectional view taken along line IIC-IIC in FIG. 2A. FIG. 2D is a cross-sectional view taken along line IID-IID in FIG. 2A.

2.1 Chamber

As illustrated in FIGS. 2A and 2B, a chamber 2a has a substantially conical shape. An end part of the chamber 2a on the large-diameter side is sealed and fixed to a reference member 2b. An aperture 291a is formed at an end part of the chamber 2a on the small-diameter side.

2.2 EUV Light Condensing Mirror

Inside the chamber 2a, the EUV light condensing mirror 23 is supported to the reference member 2b by an EUV light condensing mirror holder 23a. The EUV light condensing mirror 23 has a spheroidal reflective surface on which a multi-layer reflective film 231 is formed. The multi-layer reflective film 231 defines the first focal point and the second focal point. As described above, the first focal point is positioned in the plasma generation region 25, and the second focal point is positioned at the intermediate focal point 292. A first straight line L1 is defined to be a straight line passing through the plasma generation region 25 and the intermediate focal point 292. A first surface P1 is defined to be a surface orthogonal to the first straight line L1 and passing through the plasma generation region 25. The multi-layer reflective film 231 and the intermediate focal point 292 are positioned on respective sides of the first surface P1. A central axis in the emitted direction of the EUV light from the multi-layer reflective film 231 toward the intermediate focal point 292 is substantially aligned with the first straight line L1 and the positive Z direction. The output direction of the target 27 output from the target supply unit 26 is substantially aligned with the positive Y direction.

A tubular laser beam path wall 35 is disposed in the through-hole 24 of the EUV light condensing mirror 23 and a through-hole of the reference member 2b. The pulse laser beam 33 reflected by the laser beam condensing mirror 22 described with reference to FIG. 1 passes through the inside of the laser beam path wall 35. The target 27 supplied to the plasma generation region 25 is irradiated with the pulse laser beam 33. Through the irradiation of the target 27 with the pulse laser beam 33, plasma is generated from the target substance and radiates the radiation light 251. After the radiation of the radiation light 251, ions of the target substance contained in the plasma diffuse inside the chamber 2a as debris. Some of the ions of the target substance become neutralized and adhere to the surface of the multi-layer reflective film 231.

A small amount of gas supplied from an external device (not illustrated) flows into the chamber 2a through the inside of the laser beam path wall 35. This flow of the small amount of gas can prevent backflow of the debris of the target substance inside the laser beam path wall 35, and prevent contamination of the laser beam condensing mirror 22 or the like.

2.3 Magnet

As illustrated in FIGS. 2A and 2C, magnets 7a and 7b are disposed outside the chamber 2a. The magnets 7a and 7b are each configured by an electromagnet including a superconductive coil. The magnets 7a and 7b are positioned on respective sides of the plasma generation region 25. The magnets 7a and 7b are disposed so that the central axis of the superconductive coils thereof is substantially coaxial with each other and pass through the plasma generation region 25. When current flows in directions identical to each other through the superconductive coils, a magnetic field 70 is generated at and around the central axis of the superconductive coils. The central axis of the magnetic field 70 is substantially aligned with the central axis of the superconductive coils and the positive X direction.

The magnetic flux density in the plasma generation region 25 is preferably 0.4 T to 3.0 T inclusive. More preferably, the magnetic flux density may be 0.5 T to 1.5 T inclusive.

Some of the ions of the target substance diffusing inside the chamber 2a are trapped by the magnetic field 70. Thus, it is thought that a large amount of the target substance is distributed around dashed lines illustrated as the magnetic field 70 in FIGS. 2A and 2C.

2.4 Discharge Device

A discharge device is attached to the chamber 2a. The discharge device includes a discharge pump 30a and a discharge pipe 30b. The discharge pipe 30b has one end connected with the discharge pump 30a and has the other end connected with the inside of the chamber 2a at openings 30c. The openings 30c are disposed between the plasma generation region 25 and the magnet 7a and between the plasma generation region 25 and the magnet 7b. Alternatively, the openings 30c are disposed near the magnets 7a and 7b or at positions through which the magnetic field 70 passes. In addition, the discharge device includes a fine particle trap and a detoxification device (both not illustrated).

The discharge pump 30a performs discharging so that the pressure inside the chamber 2a becomes a predetermined pressure lower than atmospheric pressure. Since the openings 30c are positioned near the magnetic field 70 where a large amount of the target substance is distributed, the discharge device can efficiently discharge the target substance inside the chamber 2a.

2.5 First Gas Supply Unit

A first gas supply unit is attached to the chamber 2a. The first gas supply unit includes an etching gas supply source 10a and a gas supply pipe 10b. The etching gas supply source 10a includes a gas tank (not illustrated) and one of a pressure control device and a flow rate control device. The gas supply pipe 10b penetrates through the reference member 2b. The gas supply pipe 10b has one end connected with the etching gas supply source 10a outside the chamber 2a and has the other end positioned inside the chamber 2a. The gas supply pipe 10b has a plurality of first openings 10c near an outer peripheral part of a reflective surface of the EUV light condensing mirror 23. The first openings 10c are disposed along the outer peripheral part of the reflective surface.

As illustrated with Arrow F1 in FIGS. 2A to 2C, the first gas supply unit is configured to cause first gas supplied from the etching gas supply source 10a to flow along the surface of the multi-layer reflective film 231. The first gas flows from the outer peripheral part of the reflective surface in a direction approaching the first straight line L1.

The first gas contains etching gas. The etching gas contains hydrogen gas. Part of the hydrogen gas is excited by the EUV light and becomes hydrogen radical. When tin is used as the target substance, stannane, which is gas at room temperature, is generated through reaction between hydrogen radical and tin. Accordingly, tin adhered to the surface of the multi-layer reflective film 231 is etched. Alternatively, tin adhesion to the surface of the multi-layer reflective film 231 can be prevented. The stannane gas is discharged out of the chamber 2a through the openings 30c by the discharge device.

Stannane is likely to decompose into hydrogen and tin at high temperature, and thus, the EUV light condensing mirror 23 is cooled to a predetermined temperature or lower by a cooling device (not illustrated). The predetermined temperature is preferably equal to or lower than room temperature. More preferably, the predetermined temperature may be, for example, 5° C.

2.6 Obscuration Region

FIG. 2D illustrates a section of the optical path of the reflected light 252 from the EUV light condensing mirror 23 toward the intermediate focal point 292. When the EUV light condensing mirror 23 is viewed along the first straight line L1, the EUV light condensing mirror 23 has a substantially circular outer shape. Thus, the section of the optical path of the reflected light 252 including the EUV light has a substantially circular outer shape as well.

However, although the section of the optical path of the EUV light has such a circular outer shape, a region not used for exposure is set depending on specifications of the exposure apparatus 6 described with reference to FIG. 1. A space region inside the chamber 2a corresponding to such a region is referred to as an obscuration region. In FIG. 2D, a section of the obscuration region is denoted by reference sign OA. The EUV light may be shielded in the obscuration region, and thus a member that does not transmit the EUV light can be installed in the obscuration region. The obscuration region will be described later.

2.7 Flow of First Gas

As illustrated with Arrow F1 in FIGS. 2A to 2C, the first gas concentrates near the center of the EUV light condensing mirror 23 from the outer peripheral part of the reflective surface of the EUV light condensing mirror 23. The first gas has nowhere to go in the negative Z direction near the center of the EUV light condensing mirror 23, and thus changes its flow direction to the positive Z direction as illustrated in FIGS. 2A and 2B. The flow of the first gas in the positive Z direction from near the center of the EUV light condensing mirror 23 includes gas concentrated from the outer peripheral part of the reflective surface, and thus is potentially strong flow. This strong flow catches the target substance distributed in a large amount around the plasma generation region 25 and travels in the positive Z direction along the first straight line L1 as illustrated with Arrow F2.

Thereafter, the first gas in which the target substance is caught turns around just before the aperture 291a and changes its direction to the negative Z direction. Since the strong flow in the positive Z direction is present near the first straight line L1, the first gas cannot flow in the negative Z direction near the first straight line L1. Thus, the first gas flows in the negative Z direction along the wall surface of the chamber 2a at positions separated from the first straight line L1 as illustrated with Arrows F3 and F4.

In addition, a small amount of gas flows from the exposure apparatus 6 into the chamber 2a through the aperture 291a. This flow of the small amount of gas can prevent contamination of an optical element inside the exposure apparatus 6 by the debris of the target substance. Accordingly, the first gas does not flow out of the chamber 2a through the aperture 291a.

2.8 Problem

As illustrated with Arrow F3, part of the first gas having turned around just before the aperture 291a reaches near the openings 30c and is discharged by the discharge device. However, other part of the first gas having turned around just before the aperture 291a potentially reaches a peripheral part of the multi-layer reflective film 231 as illustrated with Arrow F4. The first gas having reached the peripheral part of the multi-layer reflective film 231 contains a large amount of the target substance, and this target substance potentially contaminates the multi-layer reflective film 231.

In an embodiment described below, second gas is supplied from between the first surface P1 and the intermediate focal point 292 to prevent the target substance contained in the first gas from contaminating the multi-layer reflective film 231.

Figure 3A:
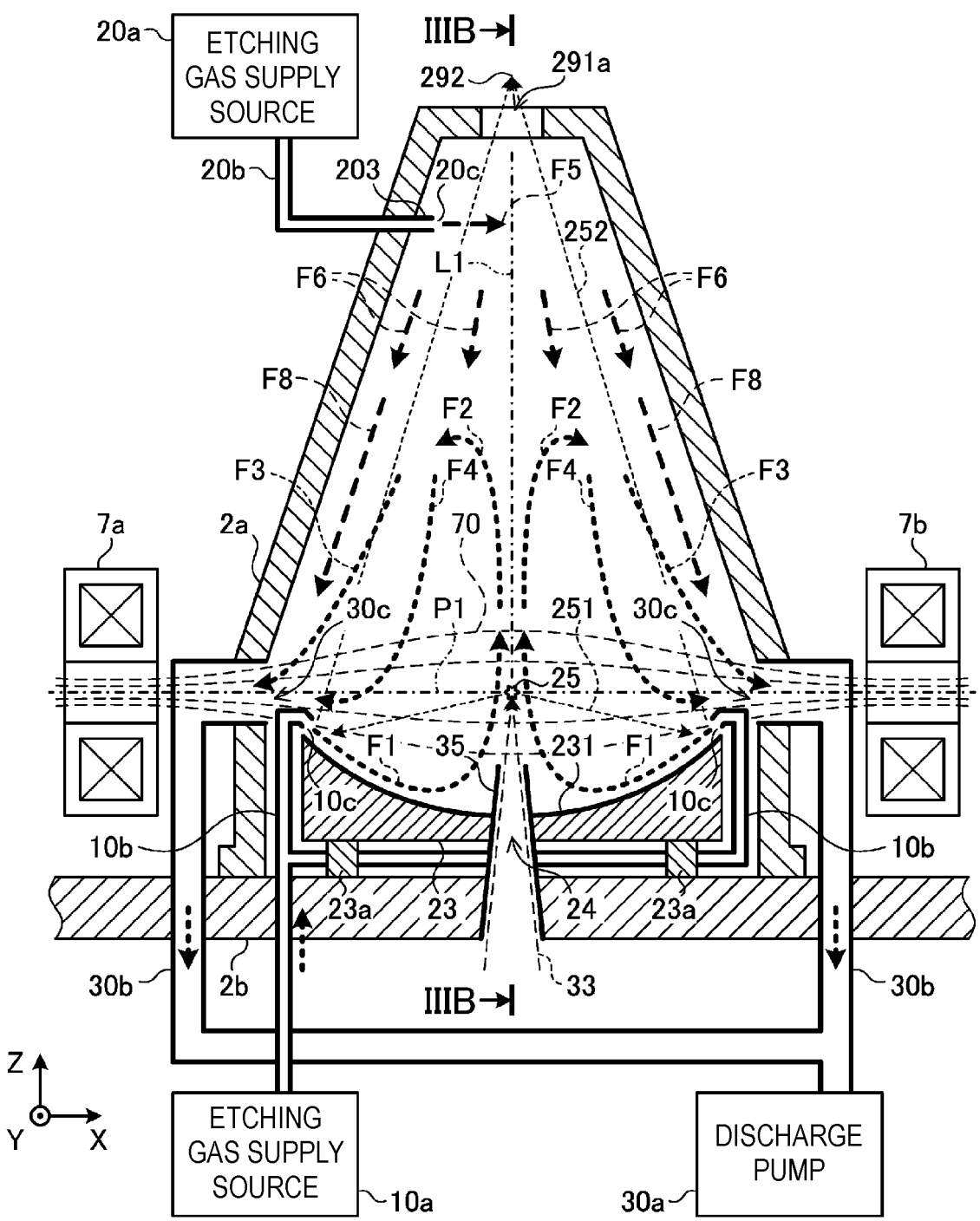
FIG. 3A schematically illustrates the configuration of an EUV light generation apparatus according to a first embodiment of the present disclosure.
Figure 3B:
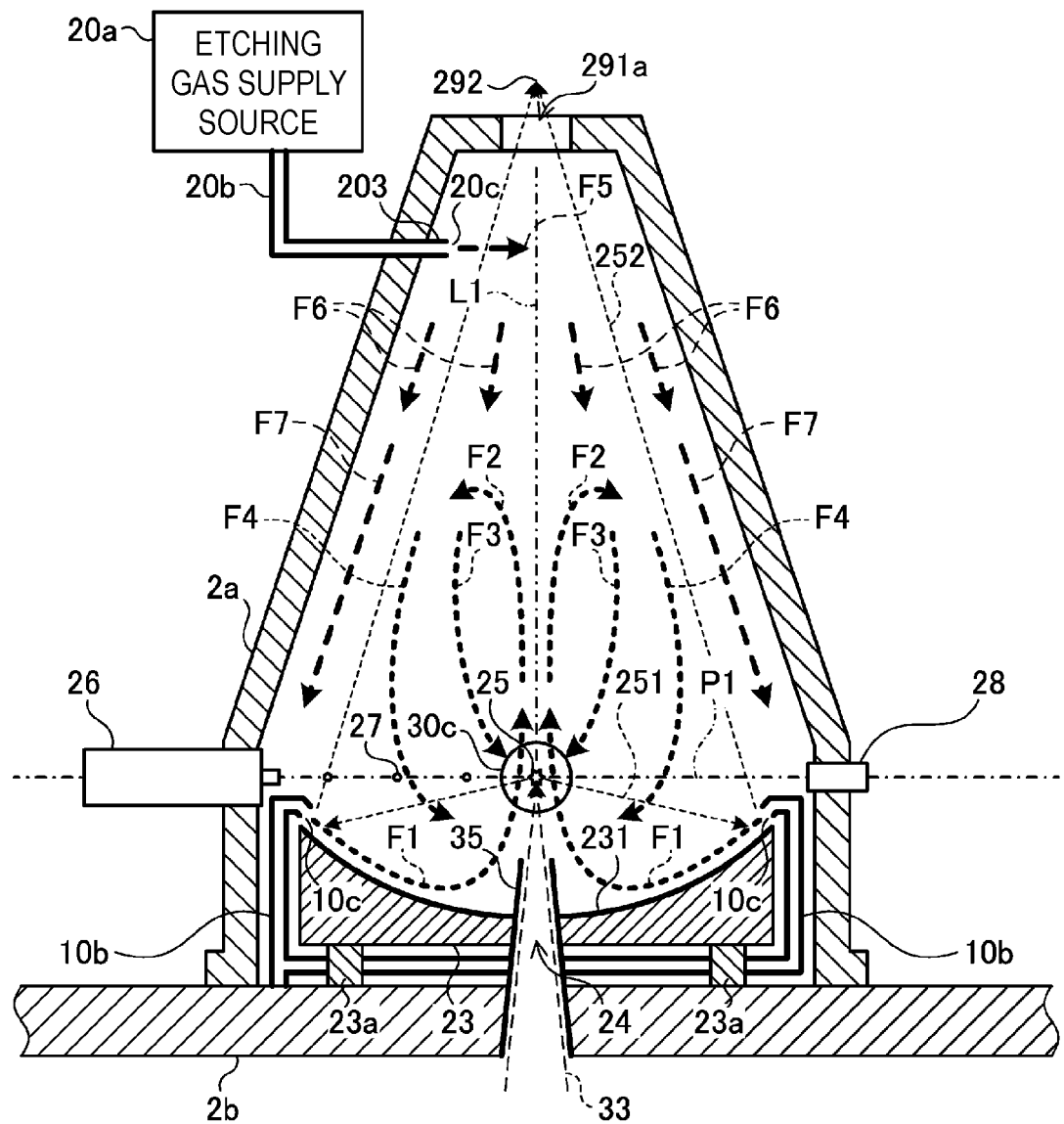
FIG. 3B is a cross-sectional view taken along line IIIB-IIIB in FIG. 3A.
Figure 3B:
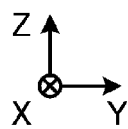

3. EUV LIGHT GENERATION APPARATUS INCLUDING SECOND GAS SUPPLY UNIT 3.1 Configuration FIG. 3A schematically illustrates the configuration of the EUV light generation apparatus according to a first embodiment of the present disclosure. FIG. 3B is a cross-sectional view taken along line IIIB-IIIB in FIG. 3A. FIG. 3A illustrates a part corresponding to FIG. 2A in the comparative example, and FIG. 3B illustrates a part corresponding to FIG. 2B. As illustrated in FIGS. 3A and 3B, the EUV light generation apparatus according to the first embodiment includes a second gas supply unit, which is different from the EUV light generation apparatus according to the comparative example. The other features are same as those of the comparative example.

The second gas supply unit includes an etching gas supply source 20a and a gas supply pipe 20b. The etching gas supply source 20a includes a gas tank (not illustrated) and one of a pressure control device and a flow rate control device. The etching gas supply source 20a may be provided separately from the etching gas supply source 10a or may be a gas tank shared with the etching gas supply source 10a.

The gas supply pipe 20b has one end connected with the etching gas supply source 20a outside of the chamber 2a and has the other end connected with a gas supply pipe 203 inside the chamber 2a. Part of the gas supply pipe 20b may be shared with part of the gas supply pipe 10b. The gas supply pipe 20b and the gas supply pipe 203 may be one pipe penetrating through the wall of the chamber 2a. The gas supply pipe 203 has a second opening 20c. The second opening 20c is positioned between the first surface P1 and the intermediate focal point 292.

As illustrated with Arrow F5, the second gas supply unit is configured to supply, into the chamber 2a, the second gas supplied from the etching gas supply source 20a. The second gas contains etching gas. The etching gas contains hydrogen gas. The first gas having passed through or near the plasma generation region 25 contains a large amount of the target substance, but the second gas includes almost no target substance.

The amount of the second gas supplied into the chamber 2a is preferably 0.6 to 4 times of the amount of the first gas supplied into the chamber 2a. The amount of the second gas supplied into the chamber 2a is preferably larger than the amount of the first gas supplied into the chamber 2a.

The amount of the second gas supplied into the chamber 2a is preferably 20 slm to 200 slm inclusive and may be, for example, 60 slm.

The amount of the first gas supplied into the chamber 2a is preferably 10 slm to 120 slm inclusive and may be, for example, 40 slm.

The expression "X slm" means X liters per minute converted under one atmospheric pressure.

The temperature of each of the first gas and the second gas supplied into the chamber 2a is preferably 16° C. or lower.

The discharge device is controlled in such a manner that the pressure inside the chamber 2a becomes 50 Pa to 150 Pa inclusive. Preferably, the pressure inside the chamber 2a may be 60 Pa to 90 Pa inclusive. For example, the pressure inside the chamber 2a may be 75 Pa.

3.2 Operation and Effect

As illustrated with Arrow F6, the second gas supplied into the chamber 2a flows in the negative Z direction, pushing the first gas toward the openings 30c of the discharge device.

The first gas strongly flows in the positive Z direction near the first straight line L1 as illustrated with Arrow F2. In addition, outside Arrow F2, the first gas having turned around into the negative Z direction flows as illustrated with Arrows F3 and F4.

Accordingly, part of the second gas flows in the negative Z direction along the wall surface of the chamber 2a at positions further outside Arrows F3 and F4 as illustrated with Arrow F7 in FIG. 3B. In other words, the flow of the second gas illustrated with Arrow F7 separates the flow of the first gas illustrated with Arrows F3 and F4 from the wall surface of the chamber 2a and pushes the flow of the first gas in the direction approaching the first straight line L1. In addition, the flow of the second gas illustrated with Arrow F7 reaches the peripheral part of the multi-layer reflective film 231 along the wall surface of the chamber 2a, which can prevent the flow of the first gas illustrated with Arrow F4 from reaching the peripheral part of the multi-layer reflective film 231. In this manner, a large part of the first gas does not reach the wall surface of the chamber 2a and the peripheral part of the multi-layer reflective film 231 but is pushed by the second gas and discharged by the discharge device. Thus, the wall surface of the chamber 2a and the multi-layer reflective film 231 can be prevented from being contaminated by the target substance.

Other part of the second gas flows in the negative Z direction along the wall surface of the chamber 2a at positions further outside Arrows F3 and F4 as illustrated with Arrow F8 in FIG. 3A. Thus, the wall surface of the chamber 2a can be prevented from being contaminated by the target substance. If the flow of the second gas illustrated with Arrow F8 reaches the multi-layer reflective film 231 across the magnetic field 70, the second gas potentially causes the target substance distributed in a large amount in the magnetic field 70 to reach the multi-layer reflective film 231. However, in the present embodiment, since the openings 30c of the discharge device are disposed near the magnetic field 70 where the target substance is distributed in a large amount, most of the second gas illustrated with Arrow F8 does not reach the multi-layer reflective film 231 but is discharged through the openings 30c. Thus, the multi-layer reflective film 231 can be prevented from being contaminated by the target substance.

4. VARIATIONS OF SECOND GAS SUPPLY UNIT 4.1 First Modification

Figure 4A:
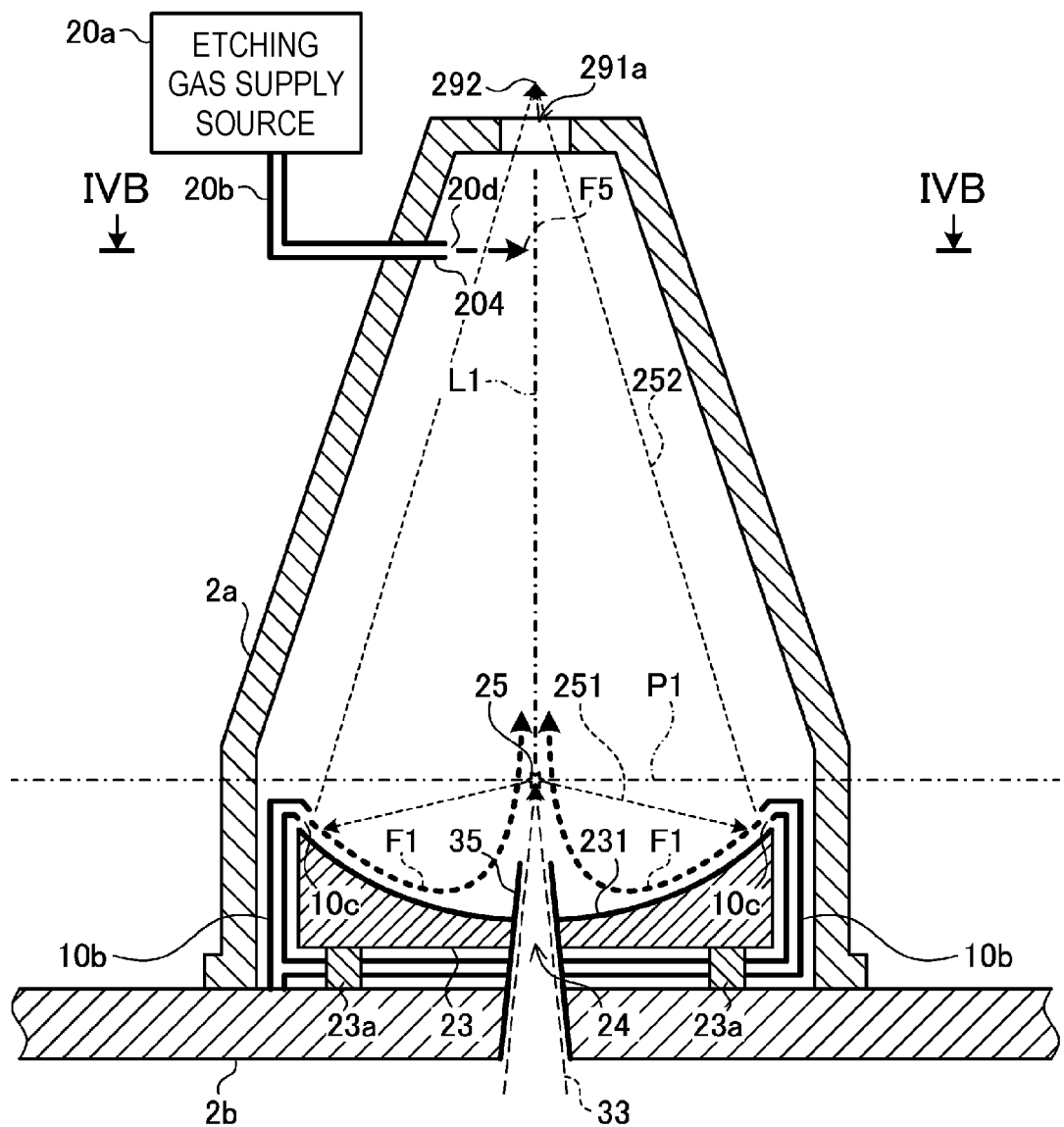
FIG. 4A schematically illustrates the configuration of an EUV light generation apparatus according to a first modification.
Figure 4B:
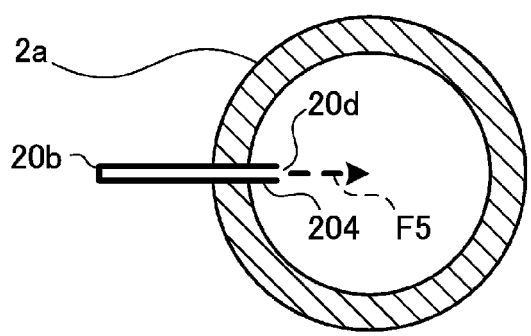
FIG. 4B is a cross-sectional view taken along line IVB-IVB in FIG. 4A.

FIG. 4A schematically illustrates the configuration of an EUV light generation apparatus according to a first modification. FIG. 4A illustrates a part corresponding to FIG. 3A or 3B in the first embodiment. FIG. 4B is a cross-sectional view taken along line IVB-IVB in FIG. 4A. FIGS. 4A and 4B omit illustration of the etching gas supply source 10a, the gas supply pipe 10b, the discharge pump 30a, the discharge pipe 30b, the magnets 7a and 7b, the target supply unit 26, the target collection unit 28, Arrows F2, F3, F4, F6, F7, and F8 illustrating gas flow, and the like. These components and arrows are same as those described with reference to FIGS. 3A and 3B.

In the EUV light generation apparatus according to the first modification, a gas supply pipe 204 connected with the gas supply pipe 20b has only one second opening 20d. The second gas supply unit discharges the second gas toward the first straight line L1 in a direction substantially parallel to the first surface P1. In this configuration as well, the flow of the second gas in the negative Z direction along the wall surface of the chamber 2a is formed.

The other features are same as those described with reference to FIGS. 3A and 3B.

4.2 Second Modification

Figure 5A:
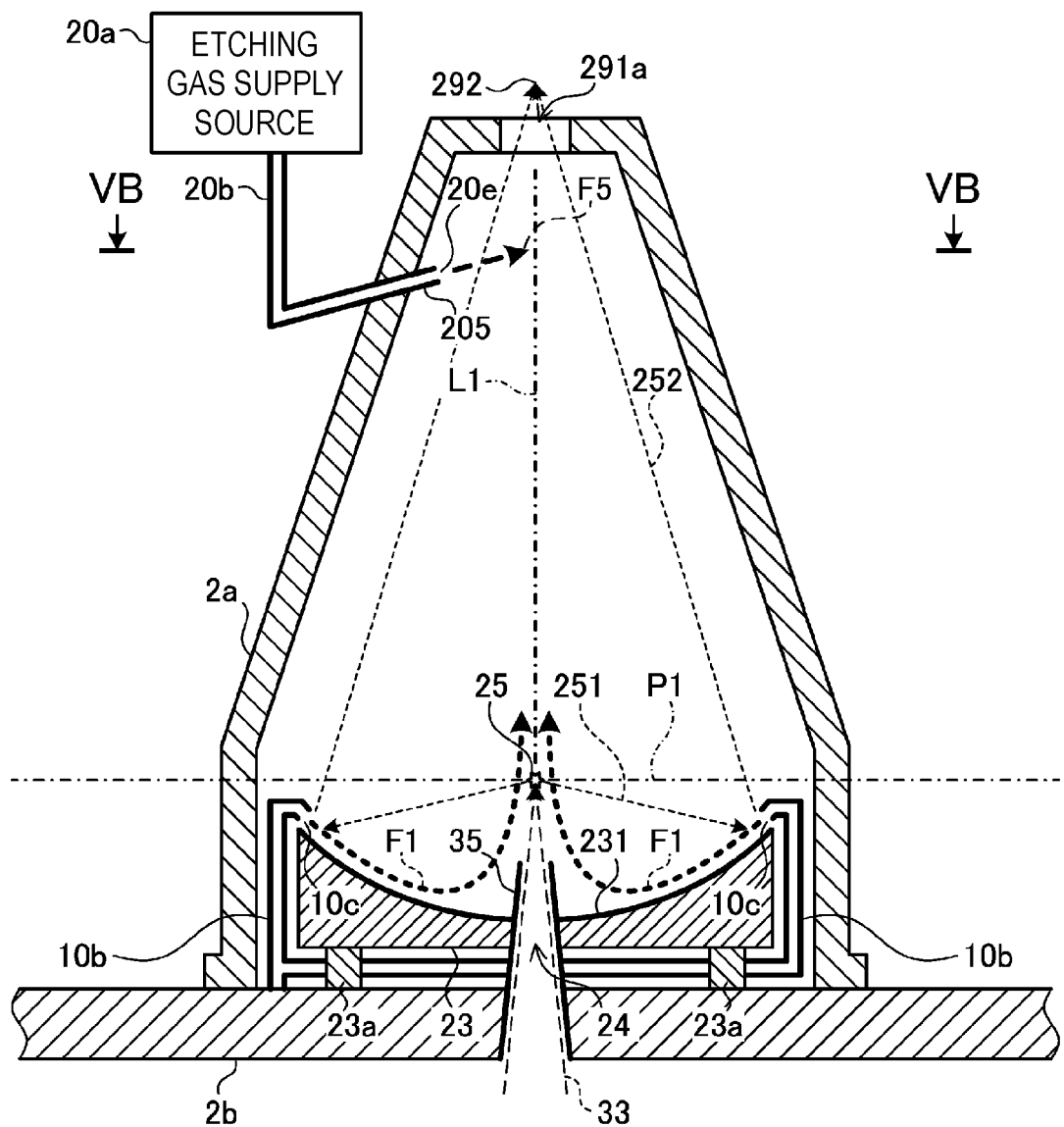
FIG. 5A schematically illustrates the configuration of an EUV light generation apparatus according to a second modification.
Figure 5B:
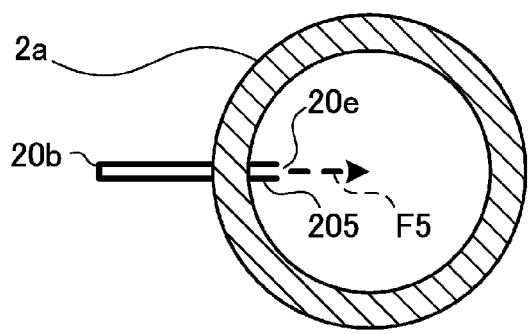
FIG. 5B is a cross-sectional view taken along line VB-VB in FIG. 5A.

FIG. 5A schematically illustrates the configuration of an EUV light generation apparatus according to a second modification. FIG. 5A illustrates a part corresponding to FIG. 3A or 3B in the first embodiment. FIG. 5B is a cross-sectional view taken along line VB-VB in FIG. 5A. FIGS. 5A and 5B omit illustration of the etching gas supply source 10a, the gas supply pipe 10b, the discharge pump 30a, the discharge pipe 30b, the magnets 7a and 7b, the target supply unit 26, the target collection unit 28, Arrows F2, F3, F4, F6, F7, and F8 illustrating gas flow, and the like. These components and arrows are same as those described with reference to FIGS. 3A and 3B.

In the EUV light generation apparatus according to the second modification, a gas supply pipe 205 connected with the gas supply pipe 20b has only one second opening 20e. The second gas supply unit discharges the second gas toward the first straight line L1 in a direction tilted away from the first surface P1. In this configuration as well, the second gas turns around into the negative Z direction just before the aperture 291a, and thus the flow of the second gas in the negative Z direction along the wall surface of the chamber 2a is formed. The flow of the second gas in the negative Z direction along the wall surface of the chamber 2a can be prevented from being biased by causing the second gas to turn around just before the aperture 291a, thereby achieving uniform flow.

The other features are same as those described with reference to FIGS. 3A and 3B.

4.3 Third Modification

Figure 6A:
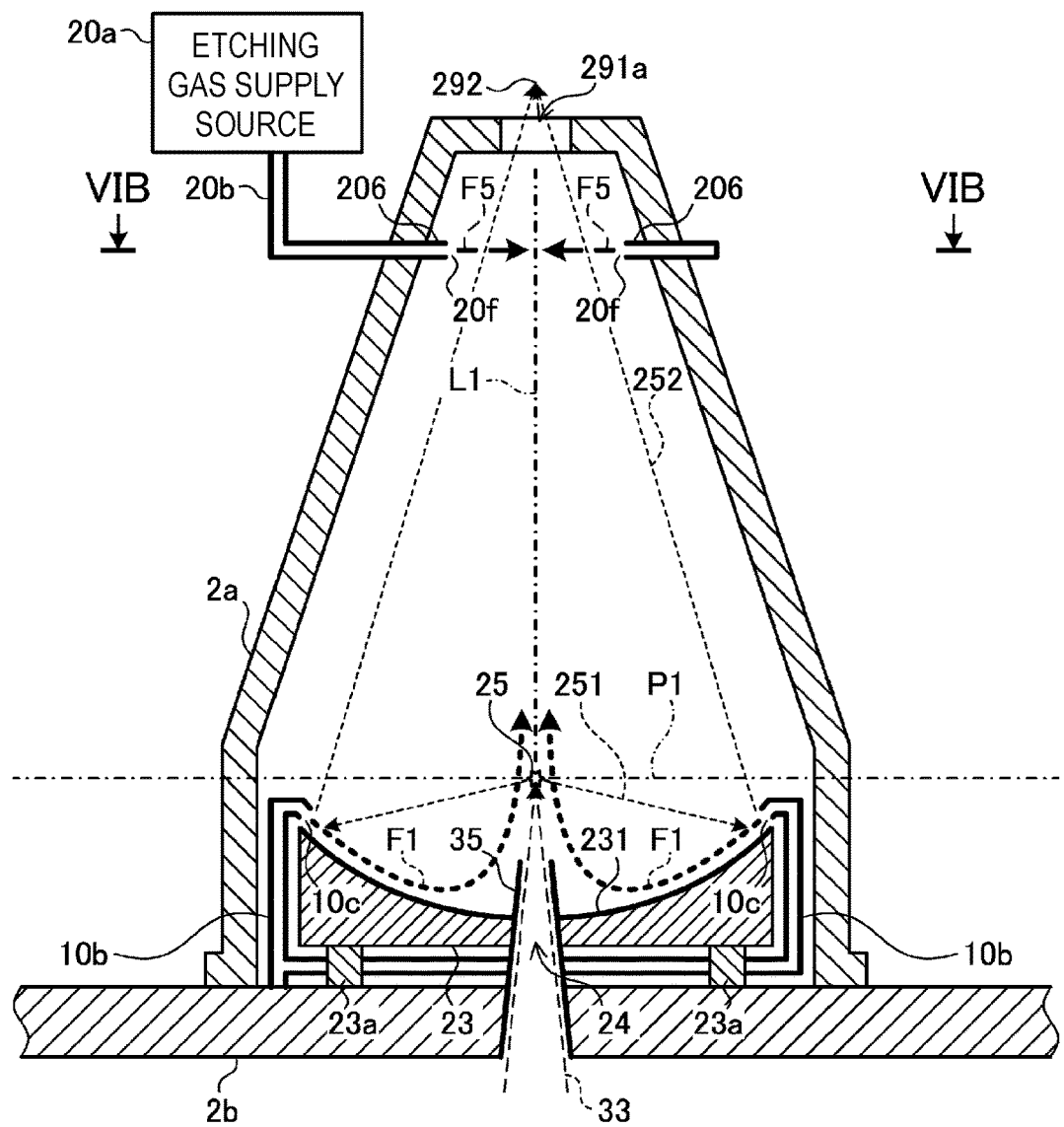
FIG. 6A schematically illustrates the configuration of an EUV light generation apparatus according to a third modification.
Figure 6B:
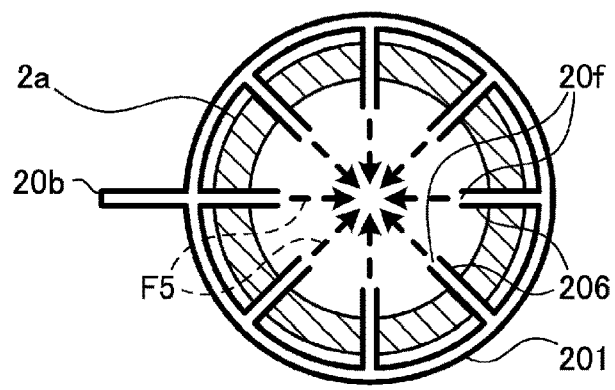
FIG. 6B is a cross-sectional view taken along line VIB-VIB in FIG. 6A.

FIG. 6A schematically illustrates the configuration of an EUV light generation apparatus according to a third modification. FIG. 6A illustrates a part corresponding to FIG. 3A or 3B in the first embodiment. FIG. 6B is a cross-sectional view taken along line VIB-VIB in FIG. 6A. FIGS. 6A and 6B omit illustration of the etching gas supply source 10a, the gas supply pipe 10b, the discharge pump 30a, the discharge pipe 30b, the magnets 7a and 7b, the target supply unit 26, the target collection unit 28, Arrows F2, F3, F4, F6, F7, and F8 illustrating gas flow, and the like. These components and arrows are same as those described with reference to FIGS. 3A and 3B.

In the EUV light generation apparatus according to the third modification, the gas supply pipe 20b is connected with a gas supply pipe 201 having an annular shape. The gas supply pipe 201 is disposed around the chamber 2a outside the chamber 2a. The gas supply pipe 201 is connected with a plurality of gas supply pipes 206. The gas supply pipes 206 each penetrate through the wall of the chamber 2a and have an opening 20f positioned inside the chamber 2a. The second gas supply unit discharges the second gas toward the first straight line L1 from a plurality of positions surrounding the first straight line L1. In this configuration as well, the flow of the second gas in the negative Z direction along the wall surface of the chamber 2a is formed. The flow of the second gas in the negative Z direction along the wall surface of the chamber 2a can be prevented from being biased by discharging the second gas from the positions surrounding the first straight line L1, thereby achieving uniform flow.

The other features are same as those described with reference to FIGS. 3A and 3B.

4.4 Fourth Modification

Figure 7A:
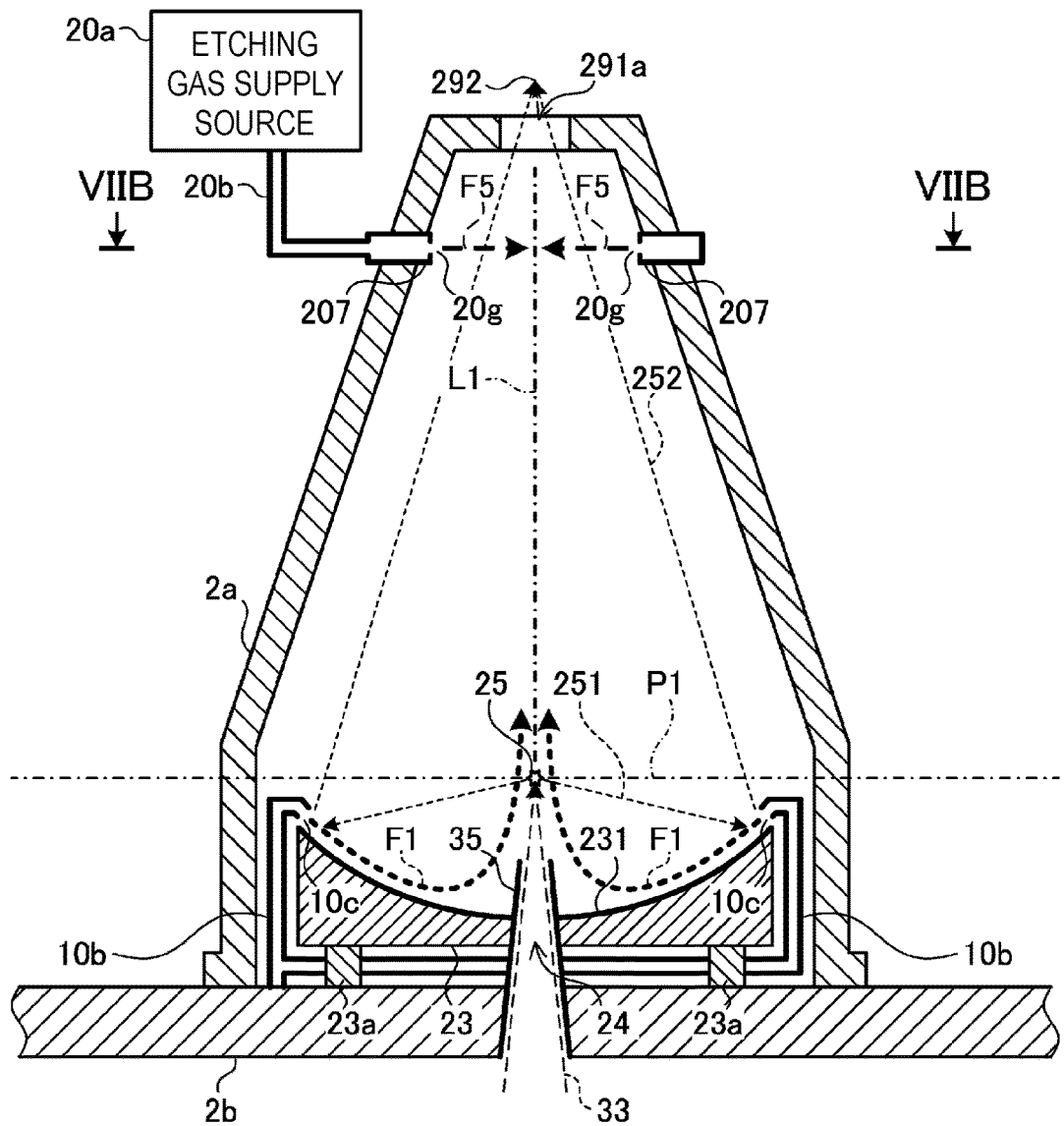
FIG. 7A schematically illustrates the configuration of an EUV light generation apparatus according to a fourth modification.
Figure 7B:
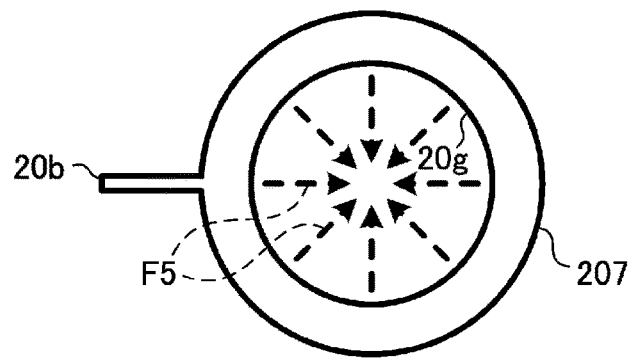
FIG. 7B is a cross-sectional view taken along line VIIB-VIIB in FIG. 7A.

FIG. 7A schematically illustrates the configuration of an EUV light generation apparatus according to a fourth modification. FIG. 7A illustrates a part corresponding to FIG. 3A or 3B in the first embodiment. FIG. 7B is a cross-sectional view taken along line VIIB-VIIB in FIG. 7A. FIGS. 7A and 7B omit illustration of the etching gas supply source 10a, the gas supply pipe 10b, the discharge pump 30a, the discharge pipe 30b, the magnets 7a and 7b, the target supply unit 26, the target collection unit 28, Arrows F2, F3, F4, F6, F7, and F8 illustrating gas flow, and the like. These components and arrows are same as those described with reference to FIGS. 3A and 3B.

In the EUV light generation apparatus according to the fourth modification, the gas supply pipe 20b is connected with a gas supply pipe 207 having an annular shape. The gas supply pipe 207 is disposed around the first straight line L1. The gas supply pipe 207 has an opening 20g having a slit shape. The opening 20g may have, for example, an opening width of 7.5 mm. The second gas supply unit discharges the second gas toward the first straight line L1 from around the first straight line L1. In this configuration as well, the flow of the second gas in the negative Z direction along the wall surface of the chamber 2a is formed. The flow of the second gas in the negative Z direction along the wall surface of the chamber 2a can be prevented from being biased by discharging the second gas from around the first straight line L1, thereby achieving uniform flow.

The other features are same as those described with reference to FIGS. 3A and 3B.

The shape of the opening 20g may be a mesh shape in place of a slit shape.

4.5 Fifth Modification

Figure 8A:
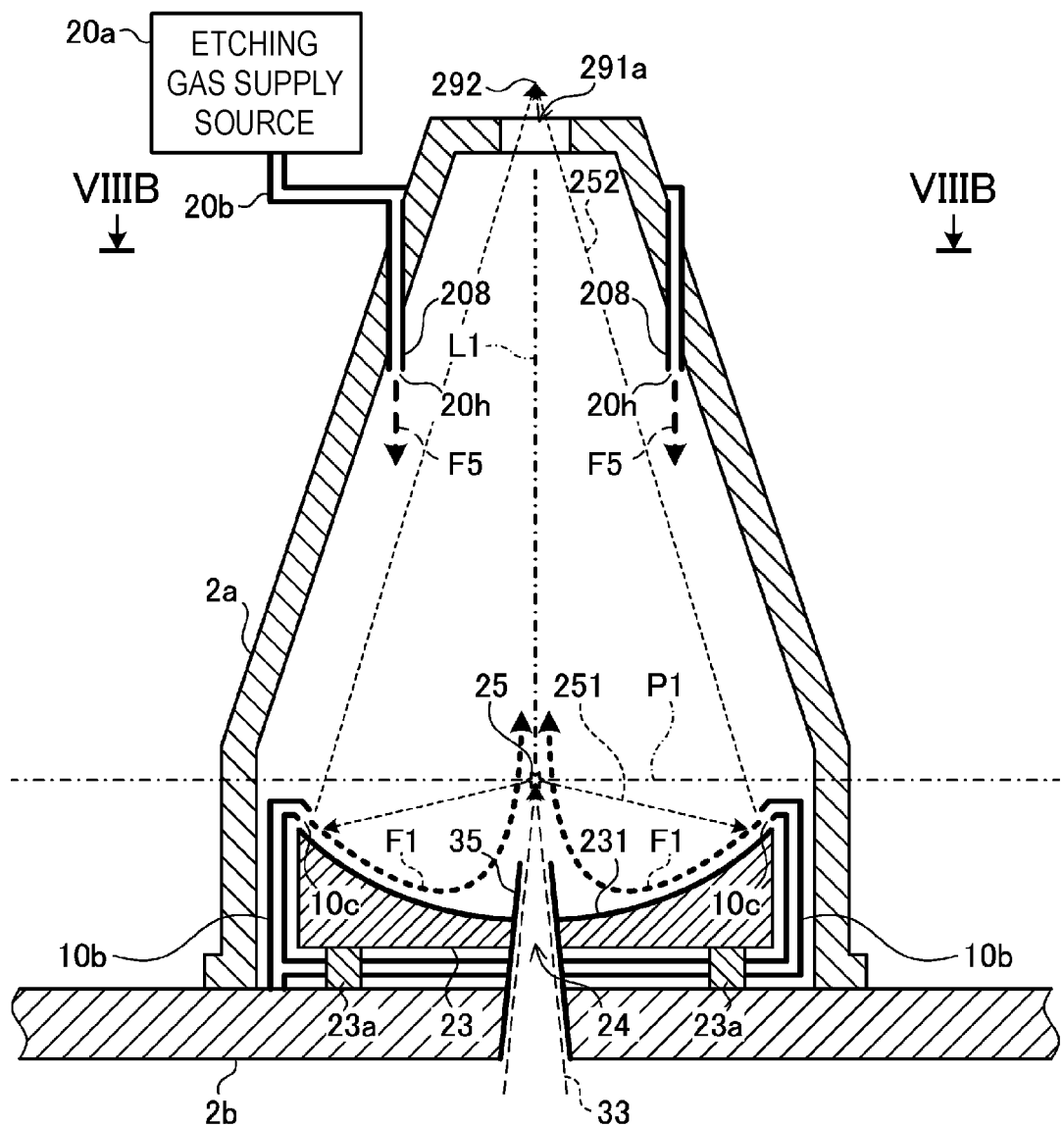
FIG. 8A schematically illustrates the configuration of an EUV light generation apparatus according to a fifth modification.
Figure 8B:
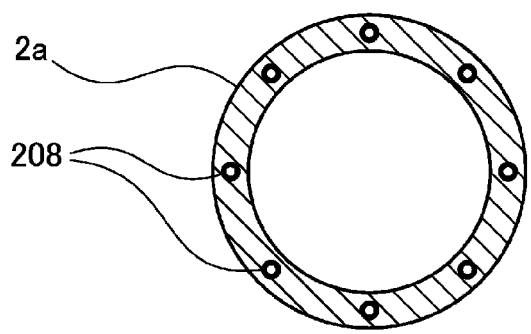
FIG. 8B is a cross-sectional view taken along line VIIIB-VIIIB in FIG. 8A.

FIG. 8A schematically illustrates the configuration of an EUV light generation apparatus according to a fifth modification. FIG. 8A illustrates a part corresponding to FIG. 3A or 3B in the first embodiment. FIG. 8B is a cross-sectional view taken along line VIIIB-VIIIB in FIG. 8A. FIGS. 8A and 8B omit illustration of the etching gas supply source 10a, the gas supply pipe 10b, the discharge pump 30a, the discharge pipe 30b, the magnets 7a and 7b, the target supply unit 26, the target collection unit 28, Arrows F2, F3, F4, F6, F7, and F8 illustrating gas flow, and the like. These components and arrows are same as those described with reference to FIGS. 3A and 3B.

In the EUV light generation apparatus according to the fifth modification, the gas supply pipe 20b is connected with a plurality of gas supply pipes 208. The gas supply pipes 208 each penetrate through the wall of the chamber 2a and have an opening 20h positioned inside the chamber 2a. The second gas supply unit discharges the second gas in the negative Z direction along the wall surface of the chamber 2a from a plurality of positions surrounding the first straight line L1. In this configuration as well, the flow of the second gas in the negative Z direction along the wall surface of the chamber 2a is formed. The flow of the second gas in the negative Z direction along the wall surface of the chamber 2a can be prevented from being biased by discharging the second gas at the positions surrounding the first straight line L1, thereby achieving uniform flow.

The other features are same as those described with reference to FIGS. 3A and 3B.

4.6 Sixth Modification

Figure 9A:
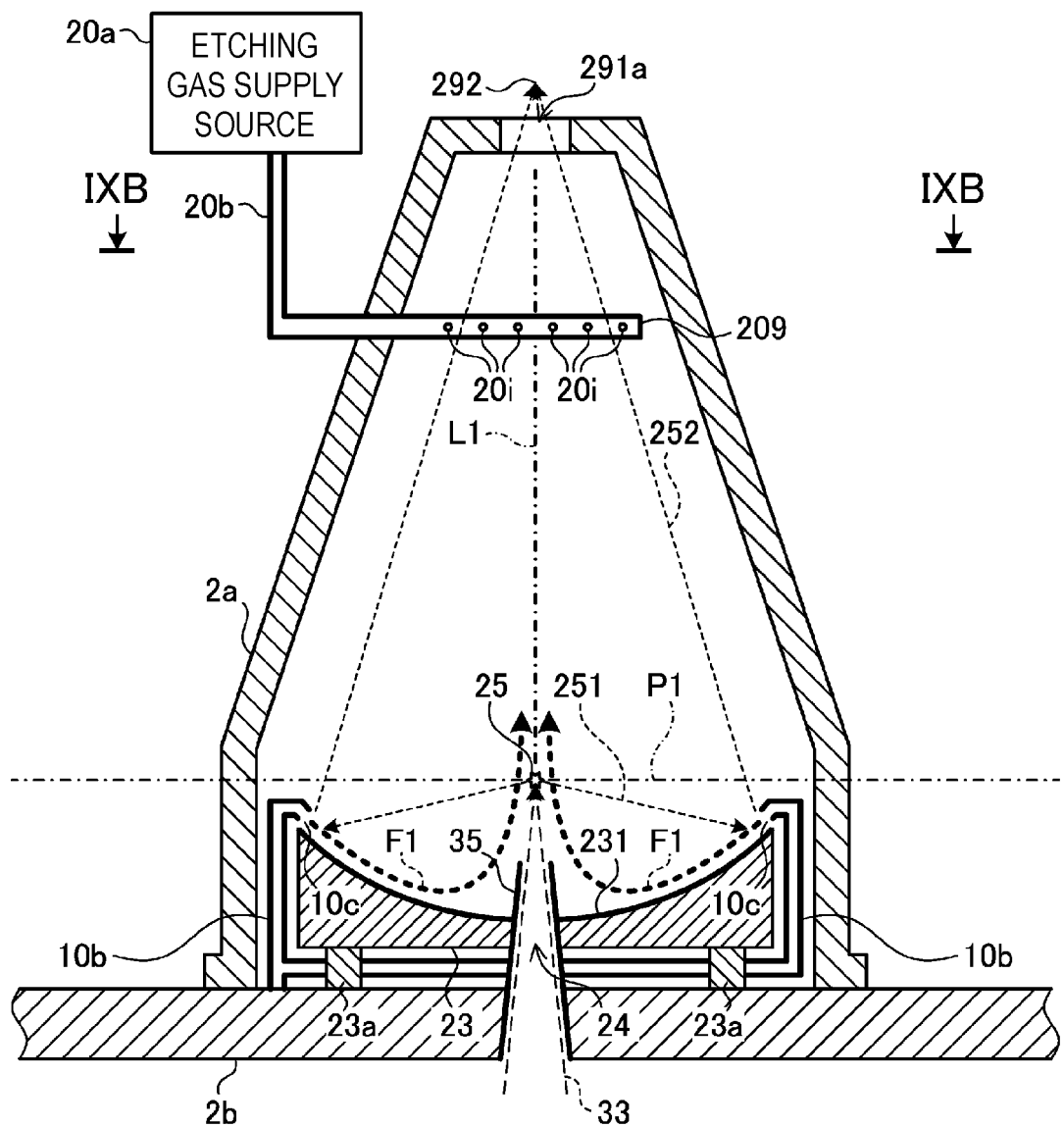
FIG. 9A schematically illustrates the configuration of an EUV light generation apparatus according to a sixth modification.
Figure 9B:
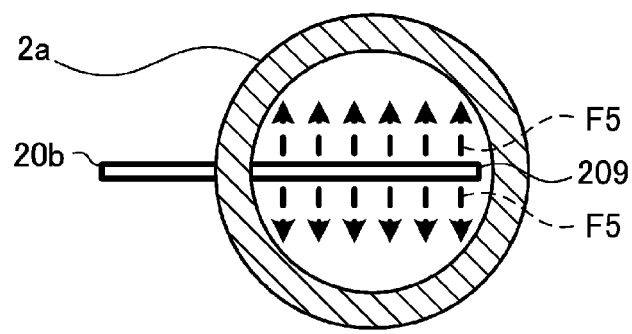
FIG. 9B is a cross-sectional view taken along line IXB-IXB in FIG. 9A.

FIG. 9A schematically illustrates the configuration of an EUV light generation apparatus according to a sixth modification. FIG. 9A illustrates a part corresponding to FIG. 3A or 3B in the first embodiment. FIG. 9B is a cross-sectional view taken along line IXB-IXB in FIG. 9A. FIGS. 9A and 9B omit illustration of the etching gas supply source 10a, the gas supply pipe 10b, the discharge pump 30a, the discharge pipe 30b, the magnets 7a and 7b, the target supply unit 26, the target collection unit 28, Arrows F2, F3, F4, F6, F7, and F8 illustrating gas flow, and the like. These components and arrows are same as those described with reference to FIGS. 3A and 3B.

In the EUV light generation apparatus according to the sixth modification, a gas supply pipe 209 connected with the gas supply pipe 20b is disposed in the obscuration region described with reference to FIG. 2D. The gas supply pipe 209 has a plurality of second openings 20i. Openings having a slit shape or a mesh shape may be formed in place of the second openings 20i. The second gas supply unit discharges the second gas toward the wall of the chamber 2a in the direction substantially parallel to the first surface P1. In this configuration as well, the flow of the second gas in the negative Z direction along the wall surface of the chamber 2a is formed. The second gas can be supplied without affecting exposure performance of the exposure apparatus 6 by disposing the gas supply pipe 209 in the obscuration region.

The other features are same as those described with reference to FIGS. 3A and 3B.

4.7 Seventh Modification

Figure 10A:
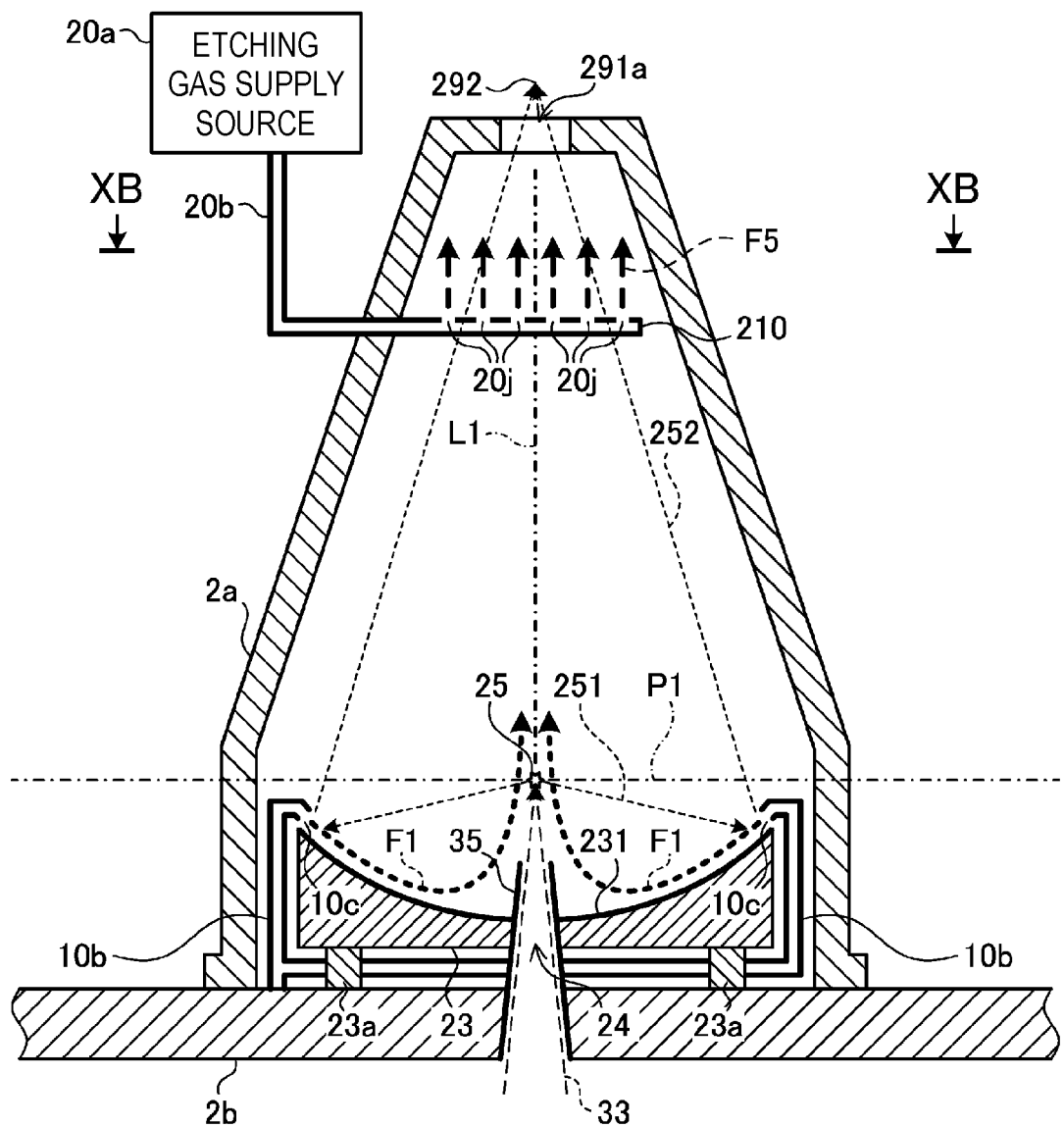
FIG. 10A schematically illustrates the configuration of an EUV light generation apparatus according to a seventh modification.
Figure 10B:
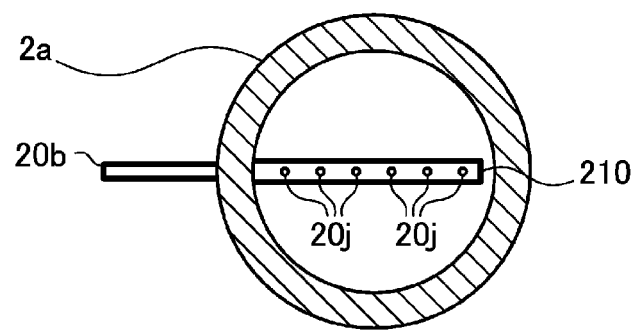
FIG. 10B is a cross-sectional view taken along line XB-XB in FIG. 10A.

FIG. 10A schematically illustrates the configuration of an EUV light generation apparatus according to a seventh modification. FIG. 10A illustrates a part corresponding to FIG. 3A or 3B in the first embodiment. FIG. 10B is a cross-sectional view taken along line XB-XB in FIG. 10A. FIGS. 10A and 10B omit illustration of the etching gas supply source 10a, the gas supply pipe 10b, the discharge pump 30a, the discharge pipe 30b, the magnets 7a and 7b, the target supply unit 26, the target collection unit 28, Arrows F2, F3, F4, F6, F7, and F8 illustrating gas flow, and the like. These components and arrows are same as those described with reference to FIGS. 3A and 3B.

In the EUV light generation apparatus according to the seventh modification, a gas supply pipe 210 connected with the gas supply pipe 20b is disposed in the obscuration region described with reference to FIG. 2D. The gas supply pipe 210 has a plurality of second openings 20*j*. The second gas supply unit discharges the second gas in a direction being away from the first surface P1. In this configuration as well, the second gas turns around into the negative Z direction just before the aperture 291*a*, and accordingly, the flow of the second gas in the negative Z direction along the wall surface of the chamber 2*a* is formed. The flow of the second gas in the negative Z direction along the wall surface of the chamber 2*a* can be prevented from being biased by causing the second gas to turn around just before the aperture 291*a*, thereby achieving uniform flow.

The other features are same as those of the sixth modification.

4.8 Eighth Modification

Figure 11A:
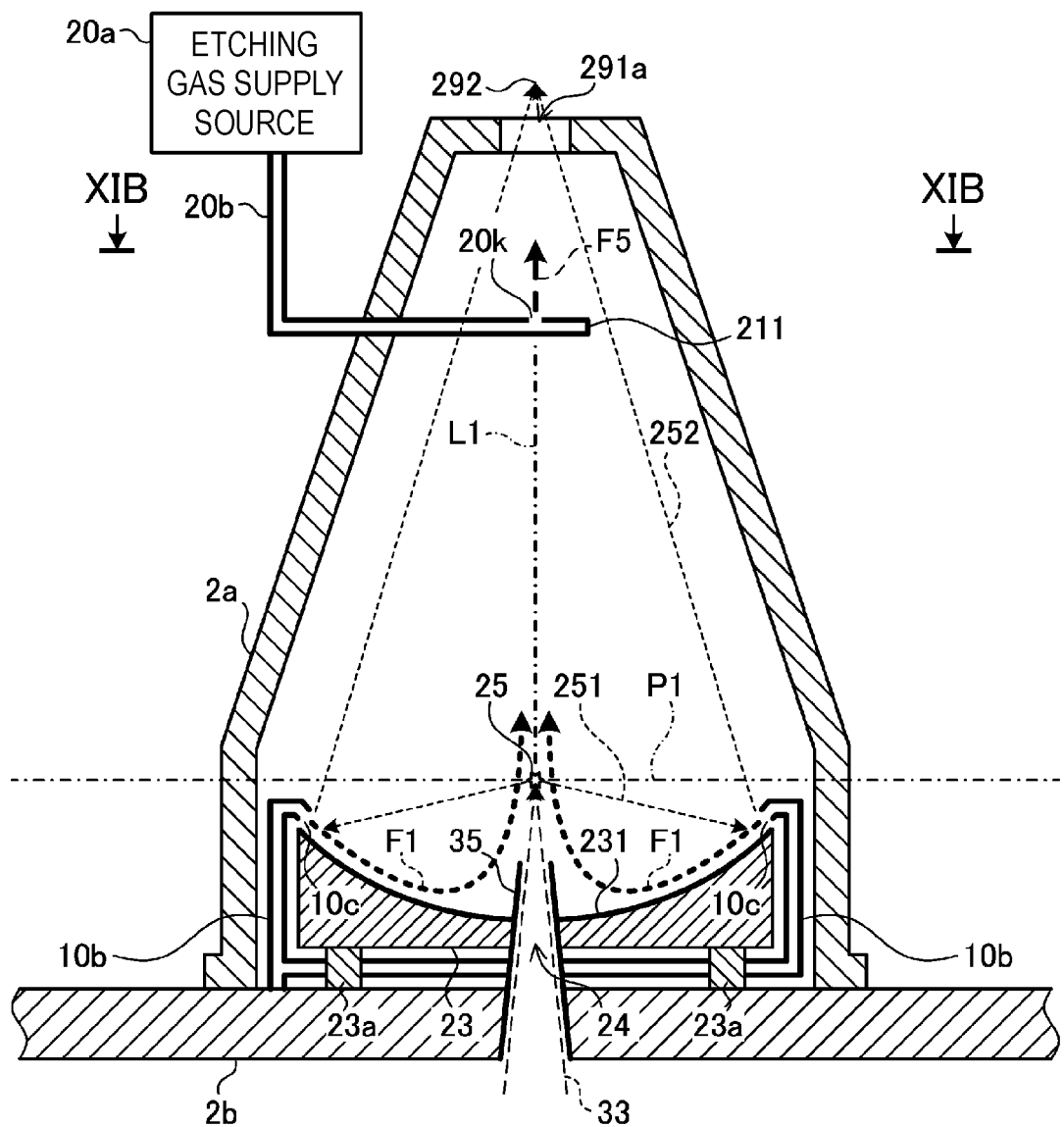
FIG. 11A schematically illustrates the configuration of an EUV light generation apparatus according to an eighth modification.
Figure 11B:
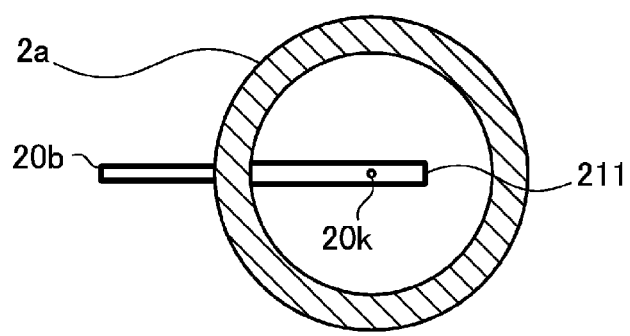
FIG. 11B is a cross-sectional view taken along line XIB-XIB in FIG. 11A.

FIG. 11A schematically illustrates the configuration of an EUV light generation apparatus according to an eighth modification. FIG. 11A illustrates a part corresponding to FIG. 3A or 3B in the first embodiment. FIG. 11B is a cross-sectional view taken along line XIB-XIB in FIG. 11A. FIGS. 11A and 11B omit illustration of the etching gas supply source 10*a*, the gas supply pipe 10*b*, the discharge pump 30*a*, the discharge pipe 30*b*, the magnets 7*a* and 7*b*, the target supply unit 26, the target collection unit 28, Arrows F2, F3, F4, F6, F7, and F8 illustrating gas flow, and the like. These components and arrows are same as those described with reference to FIGS. 3A and 3B.

In the EUV light generation apparatus according to the eighth modification, a gas supply pipe 211 connected with the gas supply pipe 20*b* is disposed in the obscuration region described with reference to FIG. 2D. The gas supply pipe 211 has only one second opening 20*k* at a position through which the first straight line L1 passes. The second gas supply unit discharges the second gas in the direction being away from the first surface P1. In this configuration as well, the second gas turns around into the negative Z direction just before the aperture 291*a*, and accordingly, the flow of the second gas in the negative Z direction along the wall surface of the chamber 2*a* is formed. The flow of the second gas in the negative Z direction along the wall surface of the chamber 2*a* can be prevented from being biased by having the second opening 20*k* at the position through which the first straight line L1 passes, thereby achieving uniform flow.

The other features are same as those of the sixth modification.

5. OTHERS

The description above is intended to be illustrative and the present disclosure is not limited thereto. Therefore, it would be obvious to those skilled in the art that various modifications to the embodiments of the present disclosure would be possible without departing from the spirit and the scope of the appended claims. Further, it would be also obvious for those skilled in the art that embodiments of the present disclosure would be appropriately combined.

The terms used throughout the present specification and the appended claims should be interpreted as non-limiting terms. For example, terms such as "comprise", "include", "have", and "contain" should not be interpreted to be exclusive of other structural elements. Further, indefinite articles "a/an" described in the present specification and the appended claims should be interpreted to mean "at least one" or "one or more".

What is claimed is:

1. An extreme ultraviolet light generation apparatus comprising:

a chamber having a conical shape including a first end part on a large-diameter side and a second end part on a small-diameter side;

an aperture formed at the second end part to cause gas to flow into the chamber;

an EUV light condensing mirror positioned inside the chamber and having a reflective surface that determines a first focal point, a second focal point, and a first straight line passing through the first and second focal points, the second focal point being farther from the reflective surface than the first focal point;

at least one magnet configured to generate a magnetic field at and around the first focal point;

a first gas supply unit configured to supply first gas into the chamber and opened near an outer peripheral part of the reflective surface to cause the first gas to flow to the reflective surface;

a discharge device configured to discharge gas inside the chamber and connected to the chamber at an exhaust port positioned between the first focal point and the at least one magnet;

a second gas supply unit configured to supply second gas into the chamber and opened in a slit shape surrounding the first straight line at a position between the second focal point and a first plane that is orthogonal to the first straight line and passes through the exhaust port;

a beam path wall disposed in a through-hole of the EUV light condensing mirror that causes the laser beam to pass through an inside of the beam path wall; and a third gas supply unit configured to supply third gas into the chamber through the inside of the beam path wall.

2. The extreme ultraviolet light generation apparatus according to claim 1, wherein the at least one magnet includes a first magnet and a second magnet disposed on respective sides of the first focal point, and the discharge device is opened at a position near the first magnet and a position near the second magnet.

3. The extreme ultraviolet light generation apparatus according to claim 1, wherein the first gas supply unit causes the first gas to flow in a direction approaching the first straight line.

4. The extreme ultraviolet light generation apparatus according to claim 1, wherein the first gas supply unit has a plurality of first openings disposed along the outer peripheral part of the EUV light condensing mirror.

5. The extreme ultraviolet light generation apparatus according to claim 1, wherein the second gas contains etching gas.

6. The extreme ultraviolet light generation apparatus according to claim 1, wherein the first gas contains hydrogen gas.

7. The extreme ultraviolet light generation apparatus according to claim 1, wherein the second gas contains hydrogen gas.

8. The extreme ultraviolet light generation apparatus according to claim 1, wherein the temperature of the second gas is equal to or lower than 16° C.

9. The extreme ultraviolet light generation apparatus according to claim 1, wherein the discharge device discharges gas inside the chamber such that pressure inside the chamber becomes 50 Pa to 150 Pa inclusive.

10. The extreme ultraviolet light generation apparatus according to claim 1, wherein a flow rate of the second gas supplied by the second gas supply unit is 0.6 to 4 times of a flow rate of the first gas supplied by the first gas supply unit.

11. The extreme ultraviolet light generation apparatus according to claim 1, wherein a flow rate of the second gas supplied by the second gas supply unit is larger than a flow rate of the first gas supplied by the first gas supply unit.

12. The extreme ultraviolet light generation apparatus according to claim 1, wherein a flow rate of the first gas supplied by the first gas supply unit is equal to or smaller than 120 liters per minute converted under one atmospheric pressure.

13. The extreme ultraviolet light generation apparatus according to claim 1, wherein a flow rate of the second gas supplied by the second gas supply unit is equal to or smaller than 200 liters per minute converted under one atmospheric pressure.

14. The extreme ultraviolet light generation apparatus according to claim 1, wherein the first gas contains etching gas.

15. An extreme ultraviolet light generation apparatus controlling method for an extreme ultraviolet light generation apparatus including:
   a chamber having a conical shape including a first end part on a large-diameter side and a second end part on a small-diameter side;
   an aperture formed at the second end part to cause gas to flow into the chamber;
   an EUV light condensing mirror positioned inside the chamber and having a reflective surface that determines a first focal point a second focal point, and a first straight line passing through the first and second focal points, the second focal point being farther from the reflective surface than the first focal point; and
   a beam path wall disposed in a through-hole of the EUV light condensing mirror that causes the laser beam to pass through an inside of the beam path wall,
the method comprising:
   generating a magnetic field at and around the first focal point;
   supplying first gas into the chamber from near an outer peripheral part of the reflective surface to the reflective surface;
   discharging gas inside the chamber from an exhaust port through which the magnetic field passes;
   supplying second gas into the chamber from a slit surrounding the first straight line at a position between the second focal point and a first plane that is orthogonal to the first straight line and passes through the exhaust port; and
   supplying third gas into the chamber through the inside of the beam path wall.

* * * * *